(12) United States Patent
Suzuki

(10) Patent No.: US 6,674,509 B2
(45) Date of Patent: Jan. 6, 2004

(54) SCANNING EXPOSURE APPARATUS AND METHOD

(75) Inventor: Toru Suzuki, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 37 days.

(21) Appl. No.: 09/965,801

(22) Filed: Oct. 1, 2001

(65) Prior Publication Data

US 2002/0051125 A1 May 2, 2002

(30) Foreign Application Priority Data

Oct. 3, 2000 (JP) ........................................ 2000-303017

(51) Int. Cl.[7] ........................... G03B 27/42; G03B 27/68
(52) U.S. Cl. .......................................... 355/53; 355/52
(58) Field of Search ............................. 355/53, 77, 52; 250/492.1, 492.2

(56) References Cited

U.S. PATENT DOCUMENTS

| 5,477,304 | A | * | 12/1995 | Nishi | 355/50 |
| 5,633,720 | A | * | 5/1997 | Takahashi | 250/548 |
| 6,195,155 | B1 | * | 2/2001 | Kawai | 355/53 |
| 6,342,942 | B1 | * | 1/2002 | Uzawa | 355/53 |
| 6,385,497 | B1 | * | 5/2002 | Ogushi et al. | 700/110 |
| 6,411,365 | B1 | * | 6/2002 | Takeishi | 355/53 |
| 2001/0055100 | A1 | * | 12/2001 | Murakami | 355/53 |

* cited by examiner

Primary Examiner—Russell Adams
Assistant Examiner—D. Ben Esplin
(74) Attorney, Agent, or Firm—Fitzpatrick, Cella, Harper & Scinto

(57) ABSTRACT

A scanning exposure apparatus for transferring a pattern of a master onto each of a plurality of shot regions defined on a substrate, while synchronously scanning the master and the substrate. The apparatus includes a master stage for moving the master, a substrate stage for moving the substrate, and a controller for controlling movement of the substrate stage during scanning exposure of the plurality of shot regions so as to assure that a setting distance in which the substrate stage is moved guarantees that a synchronization error between the master stage and the substrate stage falls within an allowable range after the substrate stage is accelerated up to a scan speed for the scanning exposure. The controller controls the movement of the substrate stage such that a setting distance for first shot region, which is exposed first upon a change in a row to which a shot region to be exposed belongs, is set to be longer than a setting distance for other shot regions.

15 Claims, 10 Drawing Sheets

FIG. 1
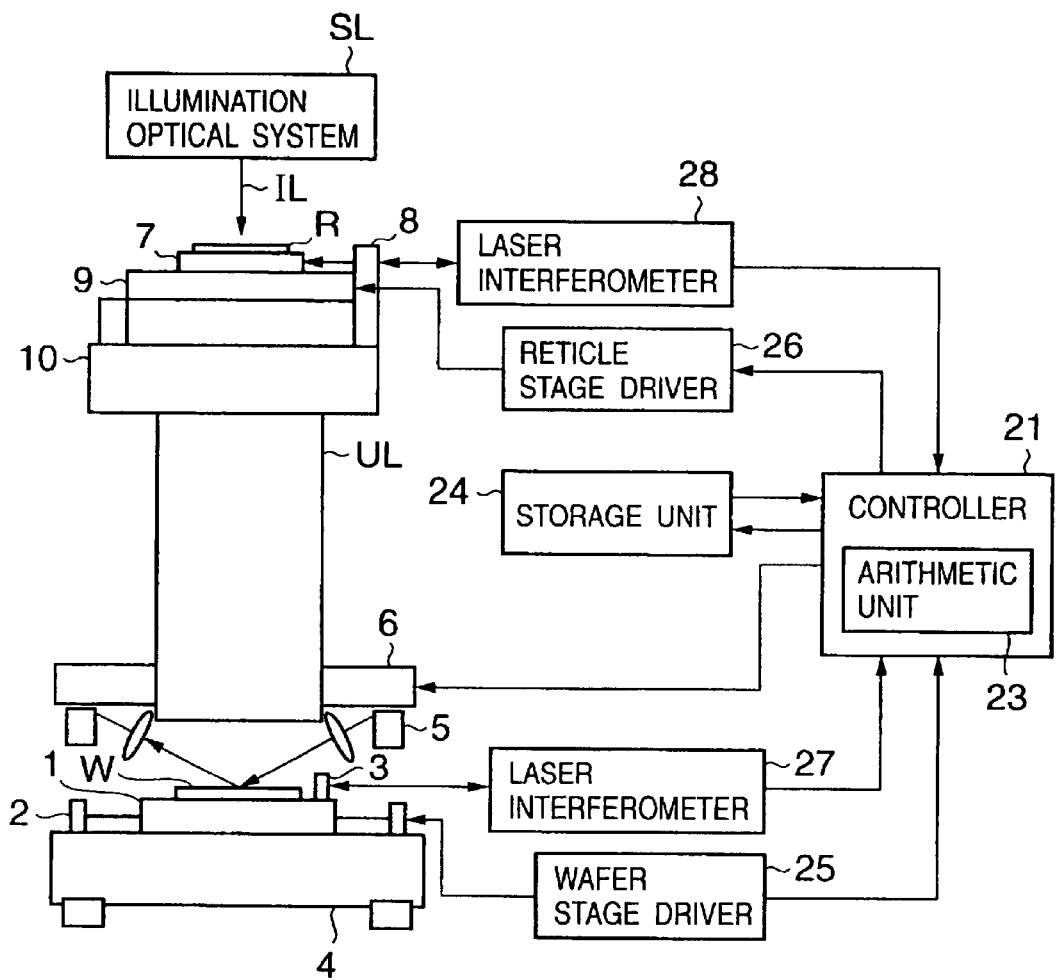
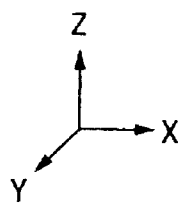

| | |
|---|---|
| URL | http://www.maintain.co.jp/db/input.html |

TROUBLE DB INPUT WINDOW

OCCURRENCE DATE [2000/3/15] ~404
TYPE OF APPARATUS [* * * * * * * * *] ~401
SUBJECT [OPERATION ERROR (START-UP ERROR)] ~403
SERIAL NUMBER S/N [465NS4580001] ~402
DEGREE OF URGENCY [D] ~405

SYMPTOM [LED IS KEPT FLICKERING AFTER POWER-ON] ~406

REMEDY [POWER ON AGAIN (PRESS RED BUTTON IN ACTIVATION)] ~407

PROGRESS [INTERIM HAS BEEN DONE] ~408

[SEND] [RESET]   410                       411                          412
LINK TO RESULT LIST DATABASE    SOFTWARE LIBRARY    OPERATION GUIDE

SEMICONDUCTOR DEVICE MANUFACTURING FLOW

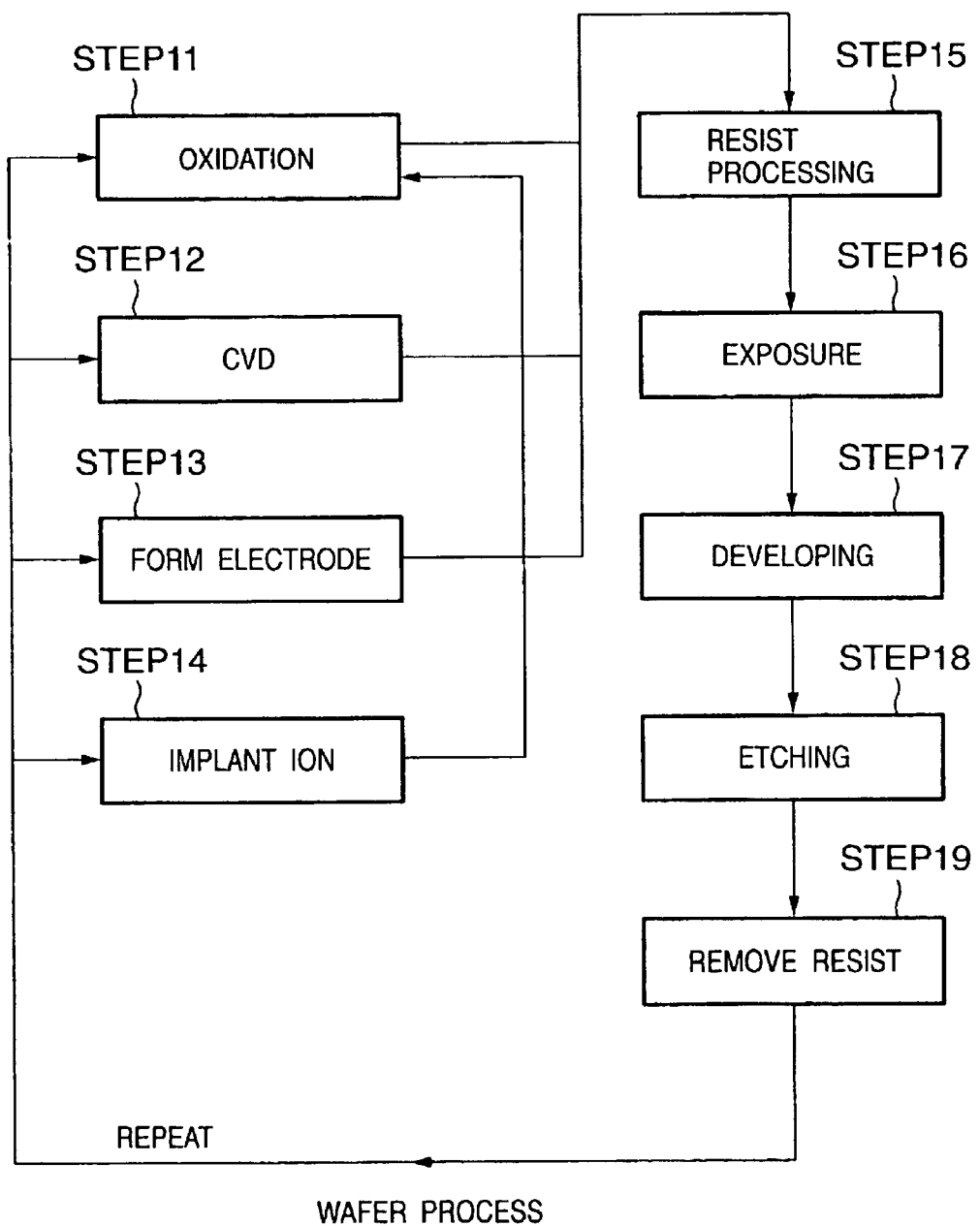

SCANNING EXPOSURE APPARATUS AND METHOD

FIELD OF THE INVENTION

The present invention relates to an exposure apparatus and a method for exposing a pattern formed on a master such as a reticle onto a substrate such as a wafer in a photolithography process for manufacturing a semiconductor element, a liquid crystal display element, or the like, and, more particularly, to a scanning exposure method and an apparatus for a step-and-scan scheme in which the master and substrate are synchronously scanned while part of a pattern on the master is projected onto the wafer, so that the pattern of the master is sequentially transferred to the shot regions on the substrate.

BACKGROUND OF THE INVENTION

In a conventional photolithography process for manufacturing, e.g., a semiconductor element, liquid crystal display element, image sensing element (e.g., a CCD), or thin-film magnetic head, a cell projection exposure apparatus such as a stepper has been used in which a pattern formed on a master such as a reticle is exposed onto a substrate such as a wafer coated with a photosensitive material.

In recent years, semiconductor device chips have tended to increase in size, and a pattern having a larger area on a reticle must be exposed onto a wafer. A projection exposure apparatus of a step-and-scan scheme is frequently used because it can expose an area larger than the irradiation field (pattern exposure region in a stationary state) of a projection optical system by synchronously scanning the reticle and wafer.

A cell projection exposure apparatus repeats an operation of stepping the shot region of an exposure object to the irradiation field, an operation of aligning the shot region and reticle, and an exposure operation for the shot region.

In a scanning projection (step-and-scan scheme) exposure apparatus, however, a wafer stage is stepped to the scanning start position of the next shot region. The wafer stage and a reticle stage are scanned from the scanning start position to accelerate them so that they reach predetermined scan speeds at the exposure start position. The relative positions of the reticle stage and wafer stage are set with high alignment accuracy. Exposure light irradiation is started to perform scanning exposure by driving the reticle stage and wafer stage at the predetermined scan speed.

Upon completing scanning exposure of one shot, a stepping operation to the next shot in the non-scan direction is started, and at the same time the wafer stage is scanned in the scan direction by a necessary distance in order to set the wafer stage before the start of scanning exposure. The wafer stage is then decelerated. Upon completing scanning in the scan direction, the scan direction is reversed, and then scanning exposure of the next shot is started. The series of operations described above are repeated. The setting distance necessary before the start of scanning exposure is obtained by the product of the scan speed and the time (setting time) required until the vibration generate upon accelerating the wafer stage falls within the allowable range in which the vibration does not interfere with exposure.

At present, the setting time is the sum of a margin and a value obtained by measuring a synchronization error from the end of acceleration and measuring a time until this error falls within the allowable range.

In the conventional scanning projection exposure apparatus, the synchronization setting time of the reticle stage and wafer stage at the time of scanning exposure is determined on the basis of the sum of the margin and the setting time measured beforehand, i.e., on the basis of the worst setting time value. In actual exposure, however, a time within which the synchronization accuracy falls within the allowable range may be shorter than the conventionally used setting time due to factors such as an exposure speed, acceleration, hardware factors, and slight differences in thrust of a linear motor coil serving as a driving source of the wafer stage due to driving coordinate values of the wafer stage. Even in this case, since the setting distance is determined on the basis of the worst setting time value at present, the scan distance is wasted, and an increase in throughput cannot be achieved.

SUMMARY OF THE INVENTION

The present invention has been made in consideration of the above situation, and has as its object to shorten the total time required for maintaining synchronization accuracy and improve the throughput by variably setting a setting distance serving as a distance for moving a wafer stage at a uniform velocity in order to guarantee that synchronization error between a master stage and the substrate stage falls within an allowable range.

According the present invention, the foregoing object is attained by providing a scanning exposure apparatus for transferring a pattern of a master onto each shot region while synchronously scanning the master and a substrate on which a plurality of shot regions are arrayed, the apparatus comprising: a master stage for moving the master; a substrate stage for moving the substrate; and a controller for controlling movement of the substrate stage over a plurality of shot regions so as to assure a setting distance serving as a distance for scanning and moving the substrate stage at a uniform velocity in order to guarantee that a synchronization error between the master stage and the substrate stage falls within an allowable range after the substrate stage is accelerated up to a scan speed for scanning exposure, wherein the controller controls the movement of the substrate stage such that a setting distance for a first shot region to be scanned and exposed upon a change in row to which a shot region of an exposure object belongs is set to be longer than a setting distance for other shot regions.

In a preferred embodiment, the controller controls the continuous movement of the substrate stage in accordance with a common setting distance for shot regions other than the first shot region to be scanned and exposed among a plurality of shot regions belonging to one row.

In a preferred embodiment, the controller controls the continuous movement of the substrate stage in accordance with a setting distance determined for each row to which a plurality of shot regions belong.

In a preferred embodiment, the setting distance is determined on the basis of a setting time until a synchronization error between the master stage and the substrate stage falls within an allowable range after the substrate stage is accelerated up to a scan speed for scanning exposure.

According to another aspect of the present invention, the foregoing object is attained by providing a scanning exposure apparatus for transferring a pattern of a master onto each shot region while synchronously scanning the master and a substrate on which a plurality of shot regions are arrayed, the apparatus comprising: a master stage for moving the master; a substrate stage for moving the substrate;

and a controller for controlling movement of the substrate stage for a plurality of shot regions so as to assure a setting distance serving as a distance for scanning and moving the substrate stage at a uniform velocity in order to guarantee that a synchronization error between the master stage and the substrate stage falls within an allowable range after the substrate stage is accelerated up to a scan speed for scanning exposure, wherein the controller controls movement of the substrate stage in accordance with a setting distance determined for each row to which a plurality of shot regions belongs.

In a preferred embodiment, the setting distance is determined on the basis of a setting time until a synchronization error between the master stage and the substrate stage falls within an allowable range after the substrate stage is accelerated up to a scan speed for scanning exposure.

According to another aspect of the present invention, the foregoing object is attained by providing a scanning exposure method of transferring a pattern of a master onto each shot region while synchronously scanning the master and a substrate on which a plurality of shot regions are arrayed, the method comprising: the control step of controlling movement of a substrate stage for a plurality of shot regions so as to assure a setting distance serving as a distance for scanning and moving the substrate stage at a uniform velocity in order to guarantee that a synchronization error between a master stage and the substrate stage falls within an allowable range after the substrate stage is accelerated up to a scan speed for scanning exposure, wherein in the control step, the movement of the substrate stage is controlled such that a setting distance for a first shot region to be scanned and exposed upon a change in row to which a shot region of an exposure object belongs is set to be longer than a setting distance for other shot regions.

In a preferred embodiment, in the control step, the continuous movement of the substrate stage is controlled in accordance with a common setting distance for shot regions other than the first shot region to be scanned and exposed among a plurality of shot regions belonging to one row.

In a preferred embodiment, in the control step, the continuous movement of the substrate stage is controlled in accordance with a setting distance determined for each row to which a plurality of shot regions belongs.

In a preferred embodiment, the setting distance is determined on the basis of a setting time until a synchronization error between the master stage and the substrate stage falls within an allowable range after the substrate stage is accelerated up to a scan speed for scanning exposure.

According to another aspect of the present invention, the foregoing object is attained by providing a scanning exposure method of transferring a pattern of a master onto each shot region while synchronously scanning the master and a substrate on which a plurality of shot regions are arrayed, the method comprising: the control step of controlling movement of a substrate stage for a plurality of shot regions so as to assure a setting distance serving as a distance for scanning and moving the substrate stage at a uniform velocity in order to guarantee that a synchronization error between a master stage and the substrate stage falls within an allowable range after the substrate stage is accelerated up to a scan speed for scanning exposure, wherein in the control step, movement of the substrate stage is controlled in accordance with a setting distance determined for each row to which a plurality of shot regions belongs.

In a preferred embodiment, the setting distance is determined on the basis of a setting time until a synchronization error between the master stage and the substrate stage falls within an allowable range after the substrate stage is accelerated up to a scan speed for scanning exposure.

According to another aspect of the present invention, the foregoing object is attained by providing a semiconductor device manufacturing method comprising the steps of: installing manufacturing apparatuses, for performing various processes, including the above scanning exposure apparatus in a semiconductor manufacturing factory, and manufacturing a semiconductor device in a plurality of processes by using the manufacturing apparatuses.

According to the preferred embodiment of the present invention, the method may comprise the steps of: connecting the manufacturing apparatuses by a local area network; and communicating information about at least one of the manufacturing apparatuses between the local area network and an external network of the semiconductor manufacturing factory.

According to the preferred embodiment of the present invention, the method may comprise the step of acquiring maintenance information of the scanning exposure apparatus by accessing a database provided by a vendor or user of the scanning exposure apparatus via the external network.

According to another aspect of the present invention, the foregoing object is attained by providing a semiconductor manufacturing factory comprising: manufacturing apparatuses for performing various processes including the above scanning exposure apparatus; a local area network for connecting the manufacturing apparatuses; and a gateway for allowing the local area network to access an external network of the factory, wherein information about at least one of the manufacturing apparatuses is communicated.

According to another aspect of the present invention, the foregoing object is attained by providing a maintenance method for the above scanning exposure apparatus that is installed in a semiconductor manufacturing factory, the method comprising the steps of: causing a vendor or user of the scanning exposure apparatus to provide a maintenance database connected to an external network of the semiconductor manufacturing factory; authenticating access from the semiconductor manufacturing factory to the maintenance database via the external network; and transmitting maintenance information accumulated in the maintenance database to the semiconductor manufacturing factory via the external network.

According to the preferred embodiment of the present invention, the apparatus may comprise: a display, a network interface and a computer for executing network software, wherein maintenance information of the scanning exposure apparatus can be communicated via a computer network.

In a preferred embodiment, the network software is connected to an external network of a factory where the scanning exposure apparatus is installed, provides on the display a user interface for accessing a maintenance database provided by a vendor or user of the scanning exposure apparatus, and enables obtaining information from the database via the external network.

According to the present invention, the foregoing object is attained by providing a semiconductor device manufacturing method comprising the steps of: installing manufacturing apparatuses, for performing various processes, including the above scanning exposure apparatus, in a semiconductor manufacturing factory; and manufacturing a semiconductor device in a plurality of processes by using the manufacturing apparatuses.

According to the preferred embodiment of the present invention, the method may comprise the steps of: connecting the manufacturing apparatuses by a local area network; and communicating information about at least one of the manufacturing apparatuses between the local area network and an external network of the semiconductor manufacturing factory.

According to the preferred embodiment of the present invention, the method may comprise the step of acquiring maintenance information of the scanning exposure apparatus by accessing a database provided by a vendor or user of the scanning exposure apparatus via the external network.

According to another aspect of the present invention, the foregoing object is attained by providing a semiconductor manufacturing factory comprising: manufacturing apparatuses, for performing various processes, including the above scanning exposure apparatus; a local area network for connecting the manufacturing apparatuses; and a gateway for allowing the local area network to access an external network of the factory, wherein information about at least one of the manufacturing apparatuses is communicated.

According to another aspect of the present invention, the foregoing object is attained by providing a maintenance method for the above scanning exposure apparatus that is installed in a semiconductor manufacturing factory, the method comprising the steps of: causing a vendor or user of the scanning exposure apparatus to provide a maintenance database connected to an external network of the semiconductor manufacturing factory; authenticating access from the semiconductor manufacturing factory to the maintenance database via the external network; and transmitting maintenance information accumulated in the maintenance database to the semiconductor manufacturing factory via the external network.

According to the preferred embodiment of the present invention, the apparatus may comprise: a display; a network interface; and a computer for executing network software, wherein maintenance information of the scanning exposure apparatus can be communicated via a computer network.

In a preferred embodiment, the network software is connected to an external network of a factory where the scanning exposure apparatus is installed, provides on the display a user interface for accessing a maintenance database provided by a vendor or user of the scanning exposure apparatus, and enables obtaining information from the database via the external network.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 1 is a schematic view showing a scanning exposure apparatus according to a preferred embodiment of the present invention;

FIG. 8 is a view showing the detailed example of a user interface;

FIG. 10 is a view for explaining a wafer process.

Figure 2:
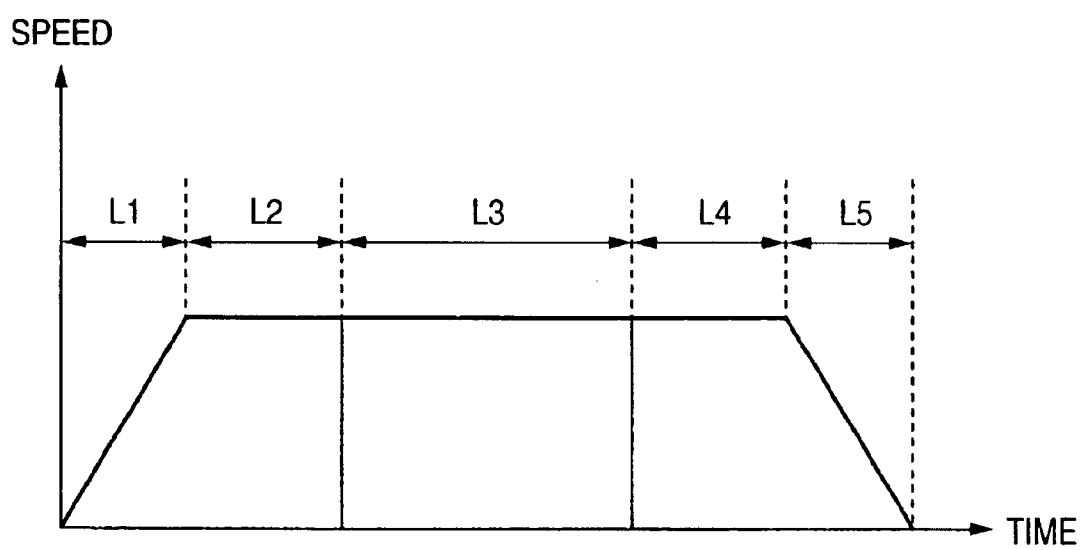
FIG. 2 is a graph showing the relationship between speed and time when a wafer stage is scanned and moved in an exposure axis (Y-axis)

DETAILED DESCRIPTION OF THE PREFERRED EMBODIMENTS (First Embodiment)

The first embodiment of the present invention will be described below with reference to the accompanying drawings. This embodiment will exemplify a projection exposure apparatus of a step-and-scan scheme for sequentially transferring and exposing a pattern formed on a reticle onto the shot regions on a wafer by scanning a reticle serving as a master and a wafer serving as a substrate in synchronism with a projection optical system.

FIG. 1 shows the schematic arrangement of the projection exposure apparatus according to this embodiment. Referring to FIG. 1, illumination light IL emitted from an illumination optical system SL including a light source, a variable field stop for shaping the illumination light into a slit, and a condenser lens illuminates a slit-like illumination region on a reticle R with a uniform illuminance profile. A pattern on the reticle R within the illumination region is inverted and reduced at a projection magnification $\alpha$ (e.g., $\alpha=\frac{1}{4}$) through a projection optical system UL. The resultant image is projected and exposed onto a slit-like irradiation field on a wafer W. Examples of the illumination light IL are a KrF excimer laser beam, an ArF excimer laser beam, and the bright lines (e.g., g- and i-lines of the ultraviolet range of an ultra-high-pressure mercury lamp.

The reticle R is placed on a reticle stage 7. The reticle stage 7 finely and two-dimensionally moves the reticle R in a plane perpendicular to the optical axis of the projection optical system UL, thereby positioning the reticle R. At the same time, the reticle stage 7 scans the reticle R in synchronism with a wafer stage 1. The reticle stage 7 has a scan-direction stroke long enough to make the entire surface of the pattern region of the reticle R cross at least the slit-like illumination region. A mirror 8 for reflecting a laser beam emitted from a laser interferometer 28 is fixed at the end portion of the reticle stage 7. The position of the reticle stage 7 is always monitored by the laser interferometer 28. The position information of the reticle stage 7 from the laser interferometer 28 is supplied to a controller 21. The controller 21 controls the position and speed of the reticle stage 7 through a reticle stage driver 26 on the basis of the position information.

The wafer W is placed on the chuck of the wafer stage 1. The wafer stage 1 performs a step-and-scan operation of repeating a stepping operation to each shot region on the wafer W and a scan operation. The controller 21 controls the wafer stage 1 to move the wafer in a vertical direction (Z direction) and tilt direction. A mirror 3 for reflecting a laser beam emitted from a laser interferometer 27 is mounted at the end portion of the wafer stage 1. The position of the wafer stage 1 is always monitored by the laser interferometer 27. The controller 21 controls the position and speed of the wafer stage 1 as in the control for the reticle stage 27.

Assume that a Z-axis is defined as a direction parallel to the optical axis of the projection optical system UL, an X-axis is defined as an axis parallel to the drawing surface in the plane perpendicular to the axis of the projection optical system UL, and a Y-axis is defined as an axis perpendicular to the drawing surface.

First of all, the setting of drive target values of the wafer stage 1 and reticle stage 7 will be described below. The laser interferometer 27 detects the position of the wafer stage 1 by using the mirror 3. The wafer stage 1 is driven in the X direction, Y direction, and rotational direction (θ direction) on the basis of the detected position. Since a triaxial laser source is mounted in the laser interferometer 27, drive amounts in the θ and tilt directions can also be detected. The laser interferometer 27 detects position information for every predetermined time interval and supplies the position information to the controller 21 which systematically controls the operation of the entire apparatus. The controller 21 outputs a drive instruction to the wafer stage driver 25 for every predetermined time interval on the basis of the position information, thereby driving the wafer stage 1 to the target position.

The laser interferometer 28 detects the position of the reticle stage 7 by using the mirror 8 in the same manner as in the wafer stage 1. The controller 21 calculates a drive amount on the basis of the detected position. The controller 21 outputs a drive instruction to the reticle stage driver 26, thereby driving the reticle stage 7 to the target position.

In this embodiment, in scanning exposure, the wafer W is scanned in the −Y direction at a speed Vw in synchronism with scanning the reticle R in the +Y direction at a speed of, e.g., Vr. The ratio (Vw/Vr) of the scan speed Vw to the scan speed Vr accurately matches the projection magnification α of the projection optical system UL for exposure from the reticle R to the wafer W. This makes it possible to accurately transfer the pattern on the reticle R onto each shot region on the wafer W. Referring to FIG. 1, reference numeral 2 denotes a linear motor; 4, a wafer stage surface plate on which the wafer stage 1 and a linear motor for driving the wafer stage 1 are mounted; 6, a lens barrel surface plate for supporting the projection optical system UL; 9, a reticle stage surface plate; and 10, an outer cylinder.

The scanning exposure method of this embodiment will be described below. Operations for scanning exposure include, e.g., stepping, stopping, and aligning operations for the wafer stage 1 and reticle stage 7 along with exposure, scanning required for setting before the start of exposure, deceleration/acceleration scanning, turn-on/turn-off operation of a light source, and scanning exposure operation. In the scanning exposure, the scanning required for setting before the start of exposure is a factor for influencing actual exposure and synchronization accuracy between the wafer stage 1 and reticle stage 7 in exposure. The scanning required for the setting is scanning required until the vibration generated by the wafer stage 1 is attenuated to a negligible state for exposure. The distance required for the setting, i.e., the setting distance is determined by the setting time and scan speed determined by the performance of the stage.

FIG. 2 is a view showing the driven stage of the wafer stage 1 in the scan axis (Y-axis) upon scanning exposure. In scanning exposure, generally, the wafer stage is accelerated up to a predetermined exposure speed (interval L1). The wafer stage is moved at a uniform velocity by the setting distance (interval L2). When the wafer stage 1 is set, exposure is done (interval L3). Stepping operation to the next shot in the non-scan axis (X-axis) is performed upon completing the exposure. At the same time, the wafer stage 1 is moved at a uniform velocity in the scan axis (Y-axis) by a distance required for setting the wafer stage 1 before the next exposure is started (interval L4). The wafer stage 1 is then decelerated (interval L5). Upon completing movement in the scan axis (Y-axis), the scan direction is reversed to start scanning for the next shot. The series of operations described above are repeated to perform exposure in the order of layout of shots defined on the wafer W.

In exposure for adjacent shots, the wafer stage 1 is moved at a uniform velocity by a distance required for setting at the end of exposure. The wafer stage 1 can be moved beforehand by the setting distance required before the start of exposure of the next shot. Exposure can be done without interrupting scanning in a moving operation between the shots. The setting distance L2 is calculated as the product (L2=Vw×Tw) of the exposure speed Vw and the setting time Tw of the wafer stage. At present, since the setting time Tw is always constant regardless of conditions, a time required for moving the wafer stage 1 by the distance L2 is constant regardless of the exposure speed.

Synchronization error required to calculate the setting time Tw will be described below.

The controller 21 calculates a target coordinate position YWN of the wafer stage 1 which changes over time in scanning exposure and a difference ΔYW (=YWN−YW) between the target coordinate position YWN and a current coordinate position YW supplied from the laser interferometer 27. The controller 21 causes the wafer stage driver 25 to drive the wafer stage 1 in accordance with the difference ΔYW. The controller 21 defines, as the target position of the reticle stage which reflects an offset from the target value of the wafer stage, a value (=YRN−ΔYW/α) obtained by subtracting from the target coordinate position YRN of the reticle stage 7 the product obtained by multiplying a reciprocal (1/α) of the projection magnification a of the illumination optical system SL in exposure from the reticle R to the wafer W by the difference ΔYW. The controller 21 reflects on the reticle stage the offset generated on the wafer stage side.

The controller 21 has an arithmetic unit 23 for calculating the difference ΔYR between the target value (YRN−ΔYW/α) and t e coordinate position YR of the stage 7 supplied from the laser interferometer 28:

$$\Delta YR = YRN - \Delta YW/\alpha - YR.$$

This difference ΔYR is the positional offset of the reticle stage 7 with respect to the target position of the reticle stage 7 corresponding to the actual position of the wafer stage 1. That is, the difference ΔYR is the synchronization error in the scan direction.

In obtaining the setting time required for setting the wafer stage 1, the arithmetic unit 23 must calculate and monitor synchronization error ΔYR for every predetermined time interval on the basis of the outputs from the laser interferometers 27 and 28. A method of determining the setting time based on the synchronization error ΔYR will be described with reference to FIG. 3.

Figure 3:
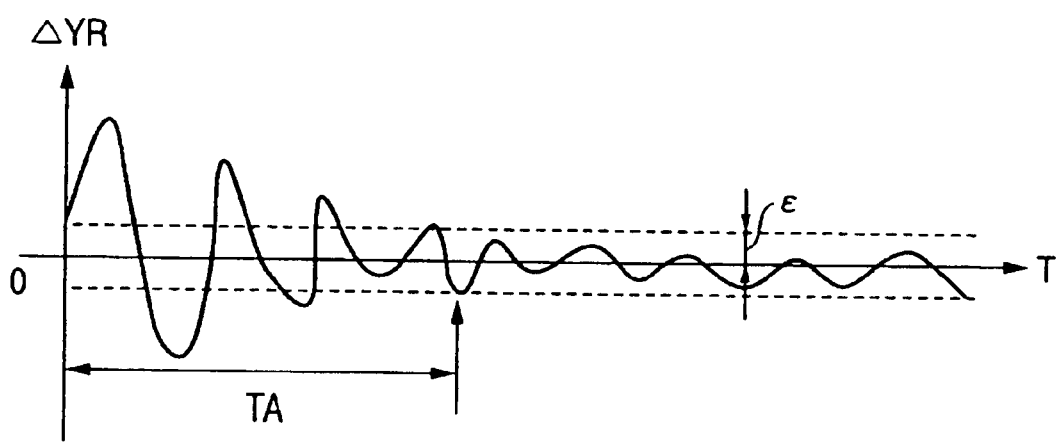
FIG. 3 is a waveform chart showing a change in synchronization error of the wafer stage as a function of time.

FIG. 3 shows a change in synchronization error ΔYR from the instant when acceleration of the wafer stage 1 is complete. More specifically, FIG. 3 shows a change in synchronization error ΔYR as a function of time when the wafer stage 1 is moved at a uniform velocity. The synchroniz error ΔYR decreases to converge the vibration with the elapse of time T. The synchronization setting time is obtained as follows. The laser interferometers 27 and 28 and the synchronization error arithmetic unit 23 measure the synchronization error ΔYR for every predetermined time interval at the end of acceleration of the wafer stage 1 and determine the time until the absolute value of the synchronization error ΔYR falls within an allowable range ε. In FIG. 3, TA is the synchronization setting time. The allowable value c is determined by performance of the apparatus and hardware factors. In this case, the synchronization setting distance is a distance obtained by multiplying the synchronization setting time by the scan speed.

Figure 4:
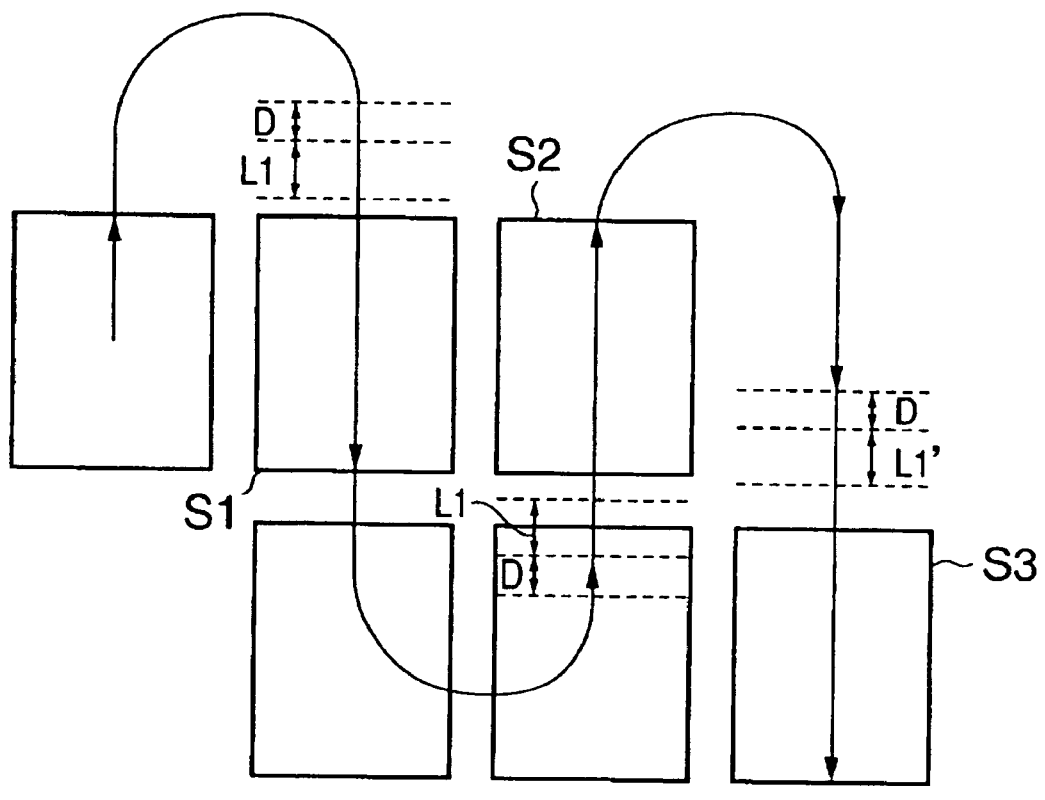
FIG. 4 is a plan view for explaining a method of adapting a synchronization setting distance in a change in a row of shots.

The exposure procedures for a plurality of shots arrayed in a matrix on the wafer according to a preferred embodiment of the present invention will be described with reference to FIG. 4. FIG. 4 is a view when paying attention to a change in a row of exposure objects as a plurality of shots in exposure according to the step-and-scan scheme.

FIG. 4 shows a state wherein exposure is performed by setting the synchronization setting distance of the first shot to be scanned and exposed upon a change in a row to be longer than the synchronization setting distance of the remaining shots upon a change in a row of the exposure objects. A distance D in FIG. 4 is a distance by which the wafer stage 1 is accelerated until it reaches the exposure scan speed. Distances L1 and L1' (L1<L1') represent the synchronization setting distances unit the synchronization error ΔYR falls within the allowable range ε upon accelerating the wafer stage 1 up to the scan speed. L1 is the synchronization setting distance without any change in row, while L1' is the synchronization setting distance of the first shot upon a change in a row.

The stepping amount of the wafer stage 1 upon a change in the row is larger than that without any change in the row. The vibration of the wafer stage 1 upon acceleration is larger than that generated by exposing parallel shots (shots having the same Y-coordinate, i.e., shots arrayed in a direction perpendicular of the scan direction in scanning exposure) without any change in the row. As a result, when the first shot scanned and exposed upon a change in the row is to be exposed, a longer synchronization setting distance than the synchronization setting distance required for exposing parallel shots without any change in the row is required. In the current exposure apparatus, since the same setting distance is designated for all the shots, the distance for properly setting the wafer stage 1 for all the shots, i.e., a value as the sum of the margin and the longest setting distance required in the row is used.

In the scanning exposure of the preferred embodiment of the present invention, to reduce an unnecessary synchronization setting distance, L1 is used as the setting distance for the parallel shots without any change in the row, such as shots S1 and S2. For the first shot S3 to be scanned and exposed upon a change in the row, the setting distance is switched to a longer setting distance L1' than the synchronization setting distance required for the shots S1 and S2, thereby starting the exposure. The synchronization setting distances L1 and L1' are obtained as follows. The controller 21 loads the synchronization setting times about parallel shots without any change in the row and the first shot to be scanned and exposed upon a change in the row. The controller 21 multiplies the scan speed in exposure with the loaded synchronization setting times. Each synchronization setting time stored in a storage unit 24 can be obtained by measuring a synchronization setting time a plurality of number of times beforehand and adding a to the average value of the measured values. The synchronization setting time increases in proportion to the scan speed (scanning exposure speed) in exposure. For this reason, the synchronization setting times are measured at, e.g., 100 mm/sec, 150 mm/sec, 200 mm/sec, and 250 mm/sec. Scanning exposure at the actual scanning exposure speed of 160 mm/sec is performed using the synchronization setting time measured at 200 mm/sec, thereby performing exposure with an optimized synchronization setting distance.

Figure 5:
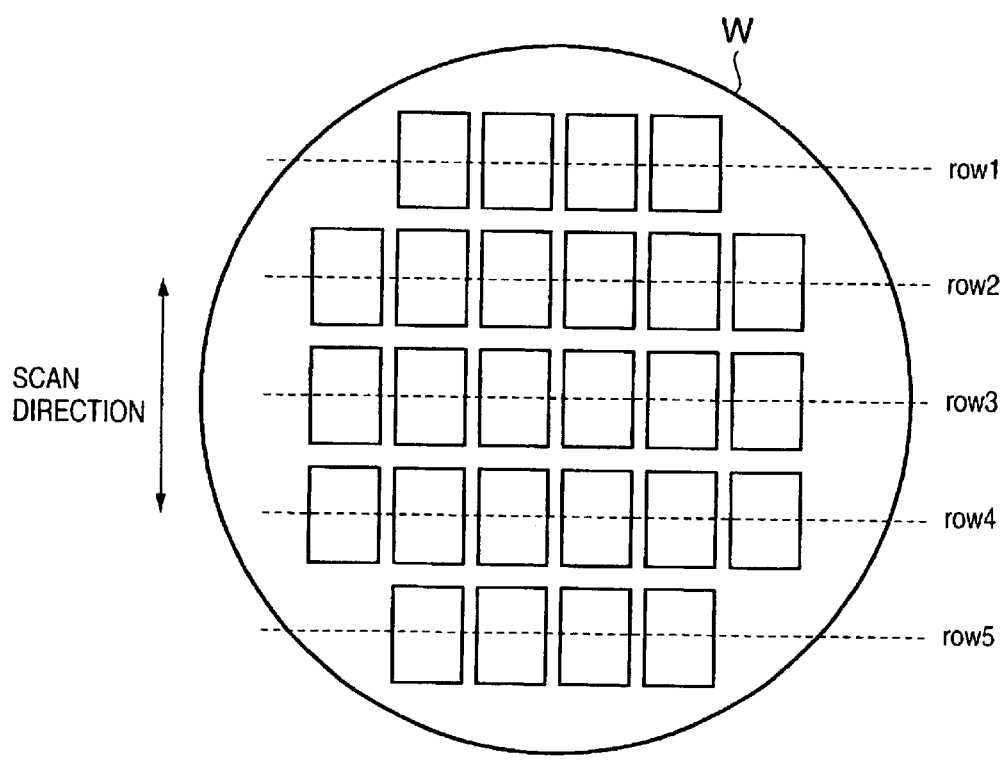
FIG. 5 is a plan view showing a given shot layout.

FIG. 5 is a view showing a wafer layout. The thrust of a linear motor serving as a driving source for the wafer stage 1 is nonuniform depending on positions, and a reaction force of a damper which supports the wafer stage surface plate changes depending on the position on the wafer stage 1. The synchronization setting time changes depending on the driving coordinates. For this reason, when the synchronization setting time is strictly measured, the measured synchronization setting time changes depending on the shots, in FIG. 5. For this reason, there can be a method of performing exposure by measuring the synchronization setting time for each shot on the layout in FIG. 5 and switching the synchronization setting distance for each shot in scanning exposure.

In practice, when the synchronization setting distance changes for each shot, stepping operation in the scan direction (Y direction) must be done in alignment to the scan start position, and the setting time is inevitably prolonged. The setting time is determined for each row (row 1 to row 5) and each shot in FIG. 5, and the setting distance is obtained on the basis of the setting time. Stepping operation to the scan start position in exposing the parallel shots in order need not be performed. The total time of the setting times required for exposing all the shots on the wafer can be shortened to improve the throughput. In this case, since the synchronization setting time changes due to the exposure speed, the synchronization setting times measured at the plurality of exposure speeds are stored in the storage unit 24.

It is preferable to combine the method of determining the synchronization setting time or synchronization setting distance described with reference to FIG. 4 with the method of determining the synchronization setting time or synchronization setting distance described with reference to FIG. 5. More specifically, it is preferable that the synchronization setting time or synchronization setting distance for a shot upon a change in row be determined for each row (for each parallel shot), and the synchronization setting time or synchronization setting distance for the first shot scanned and exposed upon a change in row be determined for each row (for each parallel shot).

(Second Embodiment)

The second embodiment of the present invention will exemplify a case in which a setting distance is obtained on the basis of a scan speed or scan acceleration. In this embodiment, a setting time corresponding to a change in scan speed or scan acceleration is measured. The measurement result is held in a storage unit 24 or the like in FIG. 1. A controller 21 can load the measurement result (setting time) from the storage unit 24 or the like. The setting time to be stored in the storage unit can be obtained by measuring the setting time a plurality of number of times and adding a variance to the measured setting times.

To measure synchronization accuracy, for example, the scan speed and scan acceleration are changed for every predetermined time interval, and the synchronization setting times measured under the respective conditions are held as a table in the storage unit 24 or the like in FIG. 1. In scanning exposure, the controller 21 obtains an optimal synchronization time in the table in accordance with the scan speed. If no optimal synchronization setting time corresponding to the scan speed is present in the table, a synchronization setting time can be calculated by linear interpolation using two approximate values in the table. Using the resultant setting time, the setting distance is obtained by the product of the setting time and scan speed. If the synchronization setting time is based on the scan acceleration, the setting distance is calculated by the product of the scan speed obtained by integrating the scan acceleration and the setting time based on the above setting time measurement result corresponding to the change in scan acceleration.

A countermeasure for the influence of stepping operation before scanning exposure on the synchronization accuracy will be described below. The influence of stepping operation immediately before scanning exposure on the synchronization accuracy depends not only on the stepping speed or acceleration but also the length of the stepping operation stroke.

For example, stepping operation with a relatively long stroke in the X-axis is performed to the start position of the first shot. The synchronization accuracy is poorer in the first shot than in other shots. In this case, only the synchronization setting distance for the first shot is made longer than that of other shots. A shorter synchronization setting distance than the synchronization setting distance for the first shot is set for other shots.

(Third Embodiment)

In each embodiment described above, the synchronization setting time is influenced even if conditions such as floor vibration change. It is preferable that the synchronization setting time be recalculated depending on the installation position of the apparatus. In consideration of the change in the state of the apparatus or floor over time, the synchronization setting time is preferably and periodically measured.

(Fourth Embodiment)

A case wherein an exposure apparatus has a learning function will be described as the fourth embodiment of the present invention. In the exposure apparatus of this embodiment, synchronization setting times measured under a plurality of conditions beforehand are held in a file in a storage medium such as a storage unit 24 or the like in FIG. 1 or in a nonvolatile memory. The stored synchronization setting times are selectively used in accordance with the exposure conditions and hard factors. Every time scanning exposure is performed for each shot region on a wafer in accordance with the stored synchronization setting time, the synchronization setting time for each shot is actually measured using laser interferometers 27 and 28 and an arithmetic unit 23. A controller 21 optimizes the synchronization setting time on the basis of the measured synchronization setting time.

As the measured synchronization setting times, values corresponding to all the shots on the wafer are stored. These stored values undergo statistical processing. If shot layouts are identical, the optimal synchronization setting time calculated by the actual synchronization setting time is set for the next wafer, thereby performing scanning exposure.

By this learning function, the synchronization setting distance is optimized any time on the basis of the actual synchronization setting time measured for each exposed shot in the exposure apparatus of this embodiment. Therefore, the setting distance is suppressed to a minimum distance, and the throughput is improved.

(Embodiment of Semiconductor Production System)

A production system for producing a semiconductor device (e.g., a semiconductor chip J such as an IC or LSI, liquid crystal panel, CCD, thin-film magnetic head, micromachine, or the like) will be exemplified. A trouble remedy or periodic maintenance of a manufacturing apparatus installed in a semiconductor manufacturing factory, or maintenance service such as software distribution is performed by using a computer network outside the manufacturing factory.

Figure 6:
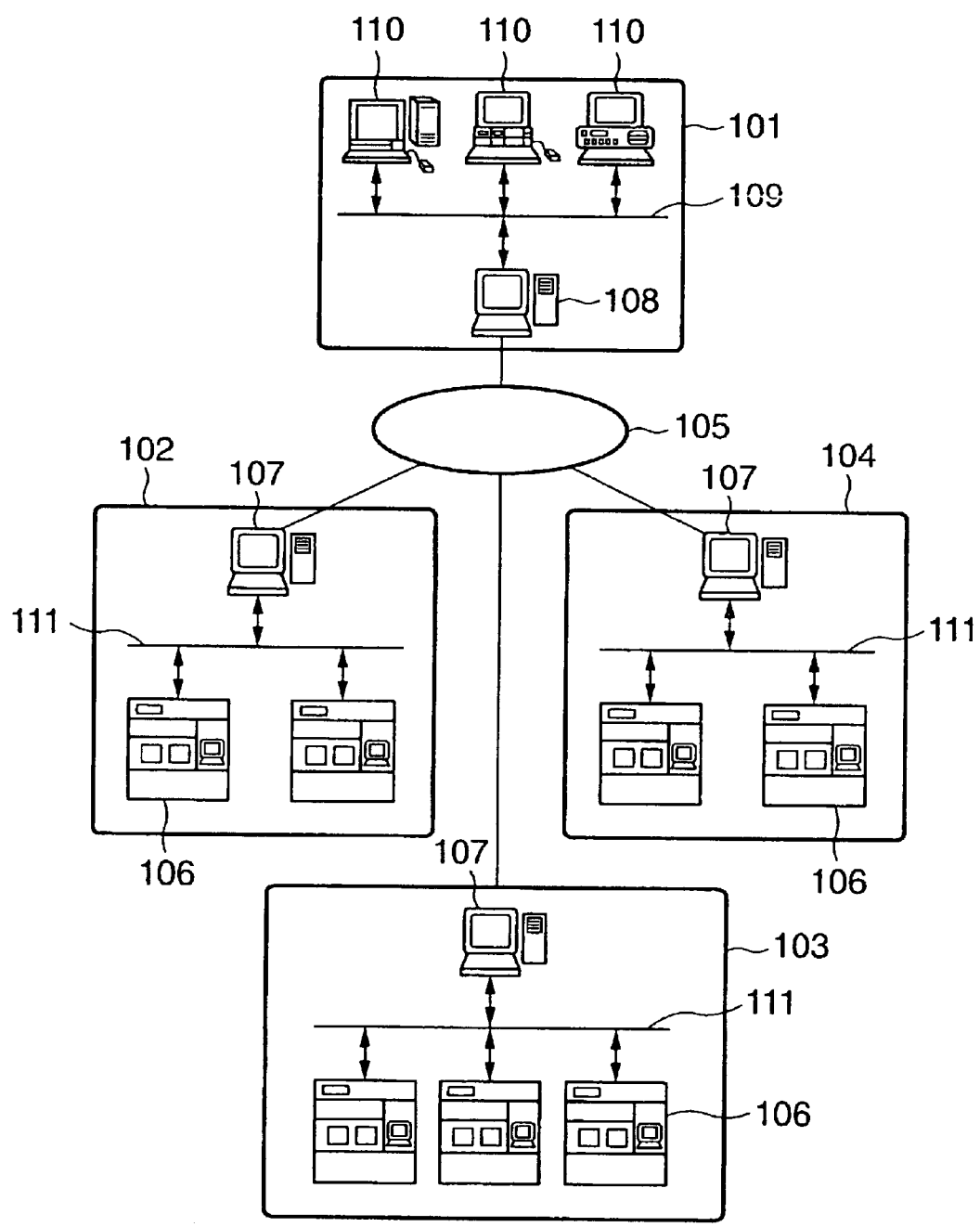
FIG. 6 is a conceptual view of a semiconductor device production system using the apparatus of the present invention when viewed from a given angle.

FIG. 6 shows the overall system cut out at a given angle. In FIG. 6, reference numeral 101 denotes a business office of a vendor (apparatus supply manufacturer) which provides a semiconductor device manufacturing apparatus. Assumed examples of the manufacturing apparatus are semiconductor manufacturing apparatuses for performing various processes used in a semiconductor manufacturing factory, such as pre-process apparatuses (lithography apparatus including an exposure apparatus, a resist processing apparatus, and an etching apparatus, an annealing apparatus, a film formation apparatus, a planarization apparatus, and the like) and post-process apparatuses (e.g., an assembly apparatus, an inspection apparatus, and the like). The business office 101 comprises a host management system 108 for providing a maintenance database for the manufacturing apparatus, a plurality of operation terminal computers 110, and a LAN (Local Area Network) 109 which connects the host management system 108 and computers 110 to construct an intranet. The host management system 108 has a gateway for connecting the LAN 109 to Internet 105 as an external network of the business office, and a security function for limiting external accesses.

Reference numerals 102 to 104 denote manufacturing factories of the semiconductor manufacturer as users of manufacturing apparatuses. The manufacturing factories 102 to 104 may belong to different manufacturers or the same manufacturer (pre-process factory, post-process factory, and the like). Each of the factories 102 to 104 is equipped with a plurality of manufacturing apparatuses 106, a LAN (Local Area Network) 111 which connects these apparatuses 106 to construct an intranet, and a host management system 107 serving as a monitoring apparatus for monitoring the operation status of each manufacturing apparatus 106. The host management system 107 in each of the factories 102 to 104 has a gateway for connecting the LAN 111 in the factory to the Internet 105 as an external network of the factory. Each factory can access the host management system 108 of the vendor 101 from the LAN 111 via the Internet 105. The security function of the host management system 108 authorizes access of only a limited user. More specifically, the factory notifies the vender via the Internet 105 of status information (e.g., the symptom of a manufacturing apparatus in trouble) representing the operation status of each manufacturing apparatus 106. The factory can receive, from the vender, response information (e.g., information designating a remedy against the trouble, or remedy software or data) corresponding to the notification, or maintenance information such as the latest software or help information. Data communication between the factories 102 to 104 and the vender 101 and data communication via the LAN 111 in each factory adopt a communication protocol (TCP/IP) generally used in the Internet. Instead of using the Internet as an external network of the factory, a dedicated-line network (e.g., ISDN) having high security which inhibits access of a third party can be adopted. It is also possible that the user constructs a database in addition to one provided by the vendor and sets the database on an external network and that the host management system authorizes access to the database from a plurality of user factories.

Figure 7:
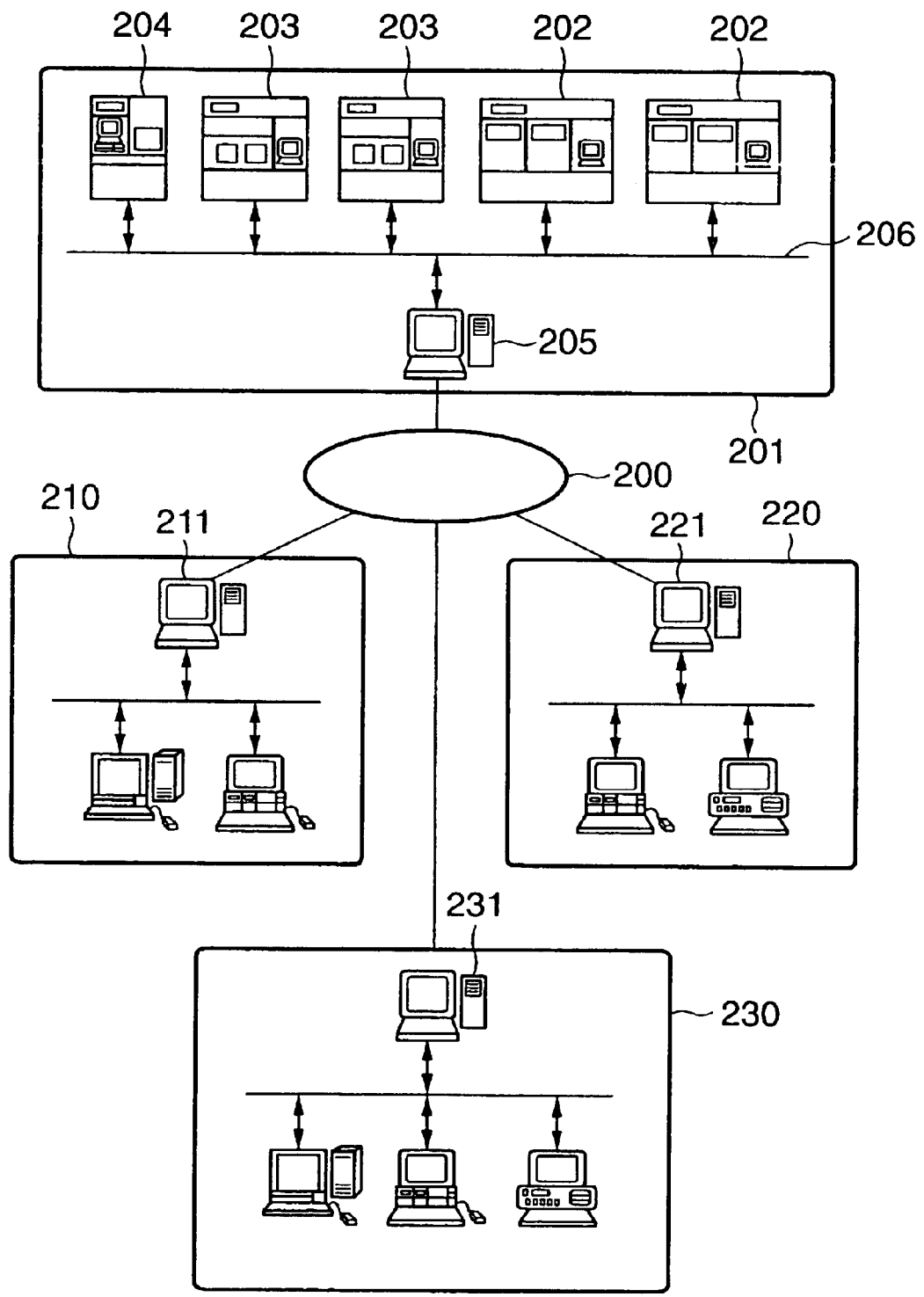
FIG. 7 is a conceptual view of a semiconductor device production system using the apparatus of the present invention when viewed from another angle.

FIG. 7 is a view showing the concept of the overall system of this embodiment that is cut out at a different angle from FIG. 6. In the above example, a plurality of user factories having manufacturing apparatuses and the management system of the manufacturing apparatus vendor are connected via an external network, and production management of each factory or information of at least one manufacturing apparatus is communicated via the external network. In the example of FIG. 7, a factory having manufacturing apparatuses of a plurality of vendors, and the management systems of the vendors for these manufacturing apparatuses are connected via the external network of the factory, and maintenance information of each manufacturing apparatus is communicated. In FIG. 7, reference numeral 201 denotes a manufacturing factory of a manufacturing apparatus user (semiconductor device manufacturer) where manufacturing apparatuses for performing various processes, e.g., an exposure apparatus 202, a resist processing apparatus 203, and a film formation apparatus 204 are installed in the manufacturing line of the factory. FIG. 7 shows only one manufacturing factory 201, but a plurality of factories are networked in practice. The respective apparatuses in the factory are connected to a LAN 206 to construct an intranet, and a host management system 205 manages the operation of the manufacturing line.

The business office of vendors (apparatus supply manufacturers) such as an exposure p apparatus manufacturer 210, a resist processing apparatus manufacturer 220, and a film formation apparatus manufacturer 230 comprise host management systems 211, 221, and 231 for executing remote maintenance for the supplied apparatuses. Each host management system has a maintenance database and a gateway for an external network, as described above. The host management system 205 for managing the apparatuses in the manufacturing factory of the user, and the management systems 211, 221, and 231 of the vendors for the respective apparatuses are connected via the Internet 200 or dedicated-line network serving as an external network 200. If a trouble occurs in any one of a series of manufacturing apparatuses along the manufacturing line in this system, the operation of the manufacturing line in this system, the operation of the manufacturing line stops. This trouble can be quickly solved by remote maintenance, from the vendor of the apparatus in trouble, via the Internet 200. This can minimize the stoppage of the manufacturing line.

Each manufacturing apparatus in the semiconductor manufacturing factory comprises a display, a network interface, and a computer for executing network access software and apparatus operating software which are stored in a storage device. The storage device is a built-in memory, hard disk, or network file server. The network access software includes a dedicated or general-purpose web browser, and provides a user interface having a window as shown in FIG. 8 on the display. While referring to this window, the operator who manages manufacturing apparatuses in each factory inputs, in input items on the windows, pieces of information such as a type 401 of manufacturing apparatus, a serial number 402, a subject 403 of trouble, an occurrence date 404, a degree 405 of urgency, a symptom 406, a remedy 407, and a progress 408. The pieces of input information are transmitted to the maintenance database via the Internet, and appropriate maintenance information is sent back from the maintenance database and displayed on the display. The user interface provided by the web browser realizes hyperlink functions 410 to 412, as shown in FIG. 8. This allows the operator to access detailed information of each item, receive the latest-version software to be used for a manufacturing apparatus from a software library provided by a vendor, and receive an operation guide (help information) as a reference for the operator in the factory. Maintenance information provided by the maintenance database includes maintenance information concerning the present invention described above. The software library also provides the latest-version software for realizing the present invention.

Figure 9:
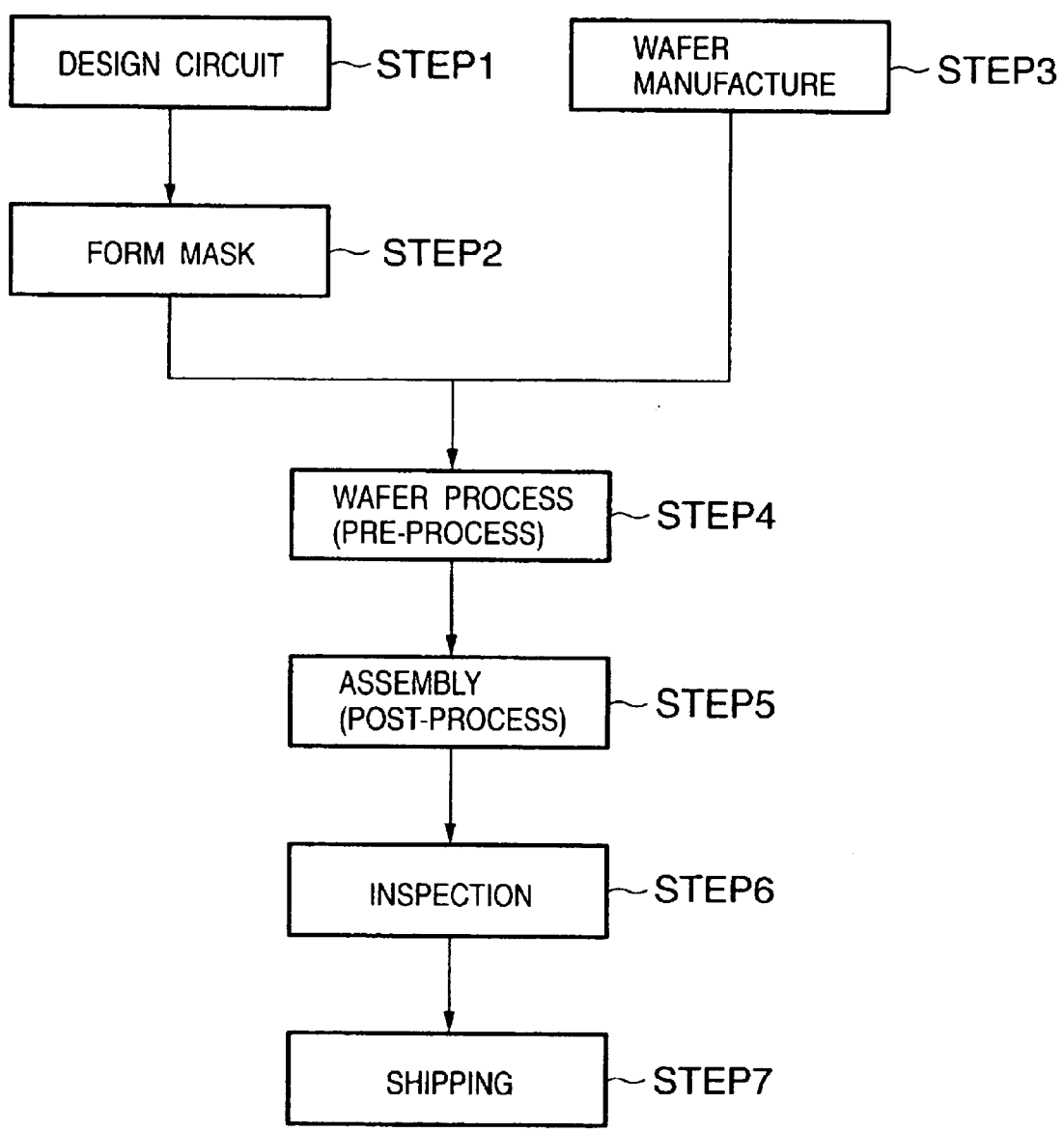
FIG. 9 is a view for explaining the flow of a device manufacturing process.

A semiconductor device manufacturing process using the above-described production system will be explained. FIG. 9 shows the flow of the whole manufacturing process of the semiconductor device. In step 1 (circuit design), a semiconductor device circuit is designed. In step 2 (mask formation), a mask on which the design circuit pattern is formed is prepared. In step 3 (wafer manufacture), a wafer is manufactured using a material such as silicon. In step 4 (wafer process) called a pre-process, an actual circuit is formed on the wafer by lithography using a prepared mask and the wafer. Step 5 (assembly) called a post-process is the step of forming a semiconductor chip by using the wafer manufactured in step 4, and includes an assembly process (dicing and bonding) and packaging process (chip encapsulation). In step 6 (inspection), inspections such as the operation confirmation test and durability test of the semiconductor device manufactured in step 5 are conducted. After these steps, the semiconductor device is completed and shipped (step 7 ). The pre-process and post-process are performed in separate dedicated factories, and maintenance is done for each of the factories by the above-described remote maintenance system. Information for production management and apparatus maintenance is communicated between the pre-process factory and the post-process factory via the Internet or dedicated-line network.

FIG. 10 shows the detailed flow of the wafer process. In step 11 (oxidation), the wafer surface is oxidized. In step 12 (CVD), an insulating film is formed on the wafer surface. In step 13 (electrode formation), an electrode is formed on the wafer by vapor deposition. In step 14 (ion implantation), ions are implanted in the wafer. In step 15 (resist processing), a photosensitive agent is applied to the wafer. In step 16 (exposure), the above-mentioned scanning exposure apparatus bakes and exposes the circuit pattern of a mask on the wafer. In step 17 (developing), the exposed wafer is developed. In step 18 (etching), the resist is etched except for the developed resist image. In step 19 (resist removal), an unnecessary resist after etching is removed. These steps are repeated to form multiple circuit patterns on the wafer. A manufacturing apparatus used in each step undergoes maintenance by the remote maintenance system, which prevents trouble in advance. Even if trouble occurs, the manufacturing apparatus can be quickly recovered. The productivity of the semiconductor device can be increased in comparison with the prior art.

According to the present invention, the setting distance serving as a distance for moving the substrate stage at a uniform velocity is set to be uniform in order to guarantee that the synchronization error between the master stage and substrate stage falls within the allowable range. Therefore, the total time required for maintaining the synchronization accuracy can be shorted, and the throughput can be improved.

As many apparently widely different embodiments of the present invention can be made without departing from the spirit and scope thereof, it is to be understood that the invention is not limited to the specific embodiments thereof except as defined in the appended claims.

What is claimed is:

1. A scanning exposure apparatus for transferring a pattern of a master onto each of a plurality of shot regions defined on a substrate, while synchronously scanning the master and the substrate, said apparatus comprising:

a master stage for moving the master;

a substrate stage for moving the substrate; and a controller for controlling movement of said substrate stage during scanning exposure of the plurality of shot regions so as to assure that a setting distance in which said substrate stage is moved guarantees that a synchronization error between said master stage and said substrate stage falls within an allowable range after said substrate stage is accelerated up to a scan speed for the scanning exposure, wherein said controller controls the movement of said substrate stage such that a setting distance for a first shot region, which is exposed first, upon a change in a row to which a shot region to be exposed belongs, is set to be longer than a setting distance for other shot regions.

2. The apparatus according to claim 1, wherein said controller controls continuous movement of said substrate stage in accordance with a common setting distance for shot regions other than the first shot region among a plurality of shot regions belonging to one row.

3. The apparatus according to claim 1, wherein said controller controls continuous movement of said substrate stage in accordance with a setting distance determined for each row of shot regions.

4. The apparatus according to claim 1, wherein the setting distance is determined on the basis of a setting time until the synchronization error between said master stage and said substrate stage falls within an allowable range after said substrate stage is accelerated up to a scan speed for scanning exposure.

5. A scanning exposure method of transferring a pattern of a master onto each of a plurality of shot regions defined on a substrate, while synchronously scanning the master and the substrate, said method comprising:

the control step of controlling movement of a substrate stage during scanning exposure of the plurality of shot regions so as to assure that a setting distance in which the substrate stage is moved guarantees that a synchronization error between a master stage and the substrate stage falls within an allowable range after the substrate stage is accelerated up to a scan speed for the scanning exposure, wherein, in the control step, the movement of the substrate stage is controlled such that a setting distance for a first shot region, which is exposed first, upon a change in a row to which a shot region to be exposed belongs, is set to be longer than a setting distance for other shot regions.

6. The method according to claim 5, wherein, in the control step, continuous movement of the substrate stage is controlled in accordance with a common setting distance for shot regions other than the first shot region among a plurality of shot regions belonging to one row.

7. The method according to claim 5, wherein, in the control step, continuous movement of the substrate stage is controlled in accordance with a setting distance determined for each row of shot regions.

8. The method according to claim 5, wherein the setting distance is determined on the basis of a setting time until the synchronization error between the master stage and the substrate stage falls within an allowable range after the substrate stage is accelerated up to a scan speed for scanning exposure.

9. A semiconductor device manufacturing method comprising the steps of:

installing manufacturing apparatuses, for performing various processes, including the scanning exposure apparatus defined in claim 1, in a semiconductor manufacturing factory; and manufacturing a semiconductor device in a plurality of processes by using the manufacturing apparatuses.

10. The method according to claim 9, further comprising the steps of:

connecting the manufacturing apparatuses by a local area network; and communicating information about at least one of the manufacturing apparatuses between the local area network and an external network of the semiconductor manufacturing factory.

11. The method according to claim 9, further comprising the step of acquiring maintenance information of the scanning exposure apparatus by accessing a database provided by a vendor or user of the scanning exposure apparatus via the external network.

12. A semiconductor manufacturing factory comprising:

manufacturing apparatuses, for performing various processes, including the scanning exposure apparatus defined in claim 1;

a local area network for connecting said manufacturing apparatuses; and a gateway for allowing the local area network to access an external network of the factory, wherein information about at least one of said manufacturing apparatuses is communicated.

13. A maintenance method for the scanning exposure apparatus defined in claim 1, which is installed in a semiconductor manufacturing factory, said method comprising the steps of:

causing a vendor or user of the scanning exposure apparatus to provide a maintenance database connected to an external network of the semiconductor manufacturing factory;

authenticating access from the semiconductor manufacturing factory to the maintenance database via the external network; and transmitting maintenance information accumulated in the maintenance database to the semiconductor manufacturing factory via the external network.

14. The apparatus according to claim 1, further comprising:

a display;

a network interface; and a computer for executing network software, wherein maintenance information of the scanning exposure apparatus can be communicated via a computer network.

15. The apparatus according to claim 14, wherein the network software is connected to an external network of a factory where the scanning exposure apparatus is installed, provides on said display a user interface for accessing a maintenance database provided by a vendor or a user of the scanning exposure apparatus, and enables obtaining information from the database via the external network.

* * * * *

UNITED STATES PATENT AND TRADEMARK OFFICE
CERTIFICATE OF CORRECTION

PATENT NO. : 6,674,509 B2
APPLICATION NO. : 09/965801
DATED : January 6, 2004
INVENTOR(S) : Toru Suzuki It is certified that error appears in the above-identified patent and that said Letters Patent is hereby corrected as shown below:

COLUMN 1:
    Line 60, "generate" should read -- generated --.

COLUMN 4:
    Line 11, "According" should read -- According to --.
    Line 47, "interface" should read -- interface, --.

COLUMN 6:
    Line 39, "i-lines" should read -- i-lines) --.

COLUMN 8:
    Line 39, "magnification a" should read -- magnification $\alpha$ --.
    Line 46, "and t e" should read -- and the --.

COLUMN 9:
    Line 10, "value c" should read --value $\varepsilon$ --.
    Line 39, "perpendicular of" should read -- perpendicular to --.
    Line 50, "exposure" should read -- exposure method --.
    Line 67, "a to" should read -- a variance to --.

COLUMN 10:
    Line 18, "shots," should read -- shots --.

COLUMN 11:
    Line 67, "chip J" should read -- chip --.

COLUMN 13:
    Line 25, "exposure p" should read -- exposure --.
    Line 39, "operation of the manufacturing line in this system, the" should be deleted.

UNITED STATES PATENT AND TRADEMARK OFFICE
CERTIFICATE OF CORRECTION

PATENT NO. : 6,674,509 B2
APPLICATION NO. : 09/965801
DATED : January 6, 2004
INVENTOR(S) : Toru Suzuki It is certified that error appears in the above-identified patent and that said Letters Patent is hereby corrected as shown below:

COLUMN 14:
Line 56, "shorted," should read -- shortened, --.

Signed and Sealed this

Twentieth Day of November, 2007

JON W. DUDAS
*Director of the United States Patent and Trademark Office*